(12) United States Patent
Suzuki

(10) Patent No.: US 6,618,119 B2
(45) Date of Patent: Sep. 9, 2003

(54) PROJECTION EXPOSURE METHOD AND APPARATUS

(75) Inventor: Kazuaki Suzuki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/899,137

(22) Filed: Jul. 6, 2001

(65) Prior Publication Data

US 2001/0040674 A1 Nov. 15, 2001

Related U.S. Application Data

(62) Division of application No. 09/089,048, filed on Jun. 2, 1998, now Pat. No. 6,292,254, which is a division of application No. 08/309,745, filed on Sep. 21, 1994, now Pat. No. 5,796,467.

(30) Foreign Application Priority Data

Sep. 21, 1993 (JP) .............................................. 5-234609

(51) Int. Cl.⁷ ...................... G03B 27/42; G03B 27/52; G03B 27/32
(52) U.S. Cl. ............................ 355/53; 355/55; 355/77
(58) Field of Search .......................... 355/52, 53, 55, 355/67–71, 77; 356/399–401; 250/548

(56) References Cited

U.S. PATENT DOCUMENTS

| | | | | |
|---|---|---|---|---|
| 4,601,560 A | * | 7/1986 | Isohata et al. ............... | 353/122 |
| 4,650,983 A | | 3/1987 | Suwa ........................... | 250/204 |
| 4,687,322 A | | 8/1987 | Tanimoto et al. ............ | 355/55 |
| 4,711,569 A | | 12/1987 | Nishimori et al. ........... | 250/548 |
| 4,780,747 A | | 10/1988 | Suzuki et al. ................ | 355/68 |
| 4,808,807 A | | 2/1989 | Hershel ....................... | 250/201 |
| 4,952,815 A | | 8/1990 | Nishi .......................... | 250/548 |
| 5,015,866 A | * | 5/1991 | Hayashi ...................... | 250/548 |
| 5,105,075 A | * | 4/1992 | Ohta et al. .................. | 355/53 X |
| 5,117,255 A | * | 5/1992 | Shiraishi et al. ............. | 355/53 |
| 5,182,615 A | * | 1/1993 | Kurosawa et al. ........... | 356/400 |
| 5,194,893 A | * | 3/1993 | Nishi .......................... | 355/53 |
| 5,241,188 A | * | 8/1993 | Mizutani ..................... | 250/548 |
| 5,270,771 A | * | 12/1993 | Sato ............................ | 355/53 |
| 5,272,501 A | * | 12/1993 | Nishi et al. .................. | 355/53 |
| 5,281,996 A | * | 1/1994 | Bruning et al. .............. | 355/77 |
| 5,286,963 A | * | 2/1994 | Torigoe ....................... | 250/201.2 |
| 5,309,197 A | * | 5/1994 | Mori et al. .................. | 355/53 |
| 5,309,198 A | * | 5/1994 | Nakagawa ................... | 355/67 |
| 5,329,336 A | * | 7/1994 | Hirano et al. ................ | 355/53 |
| 5,343,270 A | * | 8/1994 | Sakakibara et al. .......... | 355/53 |
| 5,361,122 A | * | 11/1994 | Kataoka et al. .............. | 355/53 |
| 5,386,269 A | * | 1/1995 | Kosugi ........................ | 355/43 |
| 5,416,562 A | * | 5/1995 | Ota et al. .................... | 355/53 |
| 5,424,552 A | * | 6/1995 | Tsuji et al. .................. | 250/548 |
| 5,483,311 A | * | 1/1996 | Sakakibara et al. .......... | 355/53 |
| 5,506,684 A | * | 4/1996 | Ota et al. .................... | 356/401 |
| 5,526,093 A | * | 6/1996 | Takahashi .................... | 355/53 |
| 5,539,497 A | * | 7/1996 | Nishi .......................... | 355/53 |
| 5,721,608 A | | 2/1998 | Taniguchi .................... | 355/53 |
| 6,317,195 B1 | * | 11/2001 | Taniguchi .................... | 355/53 |

* cited by examiner

*Primary Examiner*—Henry Hung Nguyen
(74) *Attorney, Agent, or Firm*—Miles & Stockbridge P.C.

(57) ABSTRACT

A scanning exposure method includes relatively moving a mask and an illuminated area of an exposure beam during a scanning exposure, an image of a pattern of said mask being projected onto a substrate through a projection system; and performing, during the scanning exposure, an imaging adjustment in order to compensate for change of the image projected onto the substrate that would be caused by a scanning error of the mask, the scanning error causing a positional variation of a pattern surface of the mask along an axis of the projection system.

9 Claims, 3 Drawing Sheets

PROJECTION EXPOSURE METHOD AND APPARATUS

CROSS-REFERENCE TO RELATED APPLICATIONS

This application is a division of application Ser. No. 09/089,048 filed Jun. 2, 1998 which is now U.S. Pat No. 6,292,254, which is a division of application Ser. No. 08/309,745 filed Sep. 21, 1994 which is now U.S. Pat. No. 5,796,467.

BACKGROUND OF THE INVENTION

1. Field of the Invention

This invention relates to projection exposure method and apparatus of the step and scan type in which for example, a mask and a photosensitive substrate are scanned in synchronism with each other relative to an illuminated area of rectangular shape or arcuate shape, whereby a pattern on the mask is exposed onto the photosensitive substrate.

2. Related Background Art

When manufacturing a semiconductive element, a liquid crystal display element, a thin film magnetic head or the like by the use of the photolithography technique, use has heretofore been made of a projection exposure apparatus in which the image of a pattern formed on a photo-mask or a reticle (hereinafter generically referred to as the "reticle") is projected through a projection optical system onto a wafer having photoresist or the like applied thereto or a photosensitive substrate such as a glass plate. The recent tendency is toward making a chip pattern on a semiconductive element large. Accordingly, in the projection exposure apparatus, it is required to expose a pattern of a larger area (make the area larger) on the photosensitive substrate.

In order to meet such a requirement for a larger area, a projection exposure apparatus of the step and scan type has been developed in recent years. In the projection exposure apparatus of this type, each shot area on a photosensitive substrate is stepping-moved to an exposure starting position, whereafter for example, relative to a rectangular, arcuate or hexagonal illuminated area (which is called a "slit-like illuminated area"), a reticle and the photosensitive substrate are scanned in synchronism with each other. Then, patterns on the reticle of larger area than the slit-like illuminated area are successively exposed onto respective shot areas.

Heretofore, in both of a projection exposure apparatus of the above-described step and scan type and an exposure apparatus of the step and repeat type which is the non-scan type, it has been usual that a focusing mechanism for a reticle pattern disposed on the object plane of a projection optical system and the exposed surface of a photosensitive substrate disposed on the image plane (imaging plane) of the projection optical system is provided only on the photosensitive substrate side. This focusing mechanism is comprised of a detecting sensor for the exposed surface of the photosensitive substrate, and a correcting mechanism for the position (focus position) and angle of inclination of the exposed surface of the photosensitive substrate in the direction of the optical axis of the projection optical system. The detecting sensor detects the focus position of the exposed surface and the inclination of the exposed surface with respect to a plane perpendicular to the optical axis. The correcting mechanism corrects the position and inclination of a stage supporting the photosensitive substrate thereon in the direction of the optical axis on the basis of the result of the detection by the detecting sensor.

However, in the projection exposure apparatus of the step and scan type, there are cases where with the scanning of the reticle, the positional relationship between the pattern on the reticle and the projection optical system varies in the direction of the optical axis of the projection optical system. Thereby, the position and inclination of the imaging plane of the projection optical system are also varied. These variations in the imaging plane result in focus deviation.

For example, suppose a 6-inch reticle as the reticle and let it be assumed that the reticle supporting surface of a reticle stage (usually the reticle has its pattern surface side vacuum-chucked and fixed) is upwardly or downwardly inclined by 1 second with respect to the scanning direction. When at this time, the 6-inch reticle is scanned from end to end, the distance between the pattern surface of the reticle and the projection optical system varies by 0.74 μm. To convert this into an amount of variation in the position of the image plane, it can be multiplied by the square of the projection magnification. Supposing a reduction projection optical system having a projection magnification of ½, the amount of variation in the image plane reaches 0.18 μm. This amount cannot be neglected particularly when the margin of the depth of focus is small as in the exposure of a pattern of sub-micron rule by the projection optical system.

SUMMARY OF THE INVENTION

In view of the above-noted point, it is an object of the present invention to provide a projection exposure method which, when the pattern of a mask is to be projection-exposed onto a photosensitive substrate by the step and scan system, can always expose a good image onto the photosensitive substrate even if with the scanning of the mask, the positional relationship of the mask to a projection optical system varies. It is also an object of the present invention to provide a projection exposure apparatus which can carry out such a projection exposure method.

The present invention, as shown, for example, in FIGS. 1 and 2 of the accompanying drawings, is a transfer method including:

the first step of disposing a mask (R) having a pattern to be transferred formed thereon and a substrate (W) with a projection optical system PL interposed therebetween in planes substantially perpendicular to the optical axis thereof; and the second step of adjusting the positional relationship between the image plane of the projection optical system (PL) and the substrate (W) in conformity with a variation in the positional relationship between the mask (R) and the projection optical system (PL) in the direction of the optical axis of the projection optical system (PL) so that the image plane of the projection optical system (PL) and the predetermined surface of the substrate (W) may coincide with each other while the mask (R) and the substrate (W) are moved in a predetermined direction perpendicular to the optical axis of the projection optical system (PL) in order to transfer a pattern on the mask (R) onto the substrate (W).

Also, the projection exposure apparatus of the present invention, as shown, for example, in FIGS. 1 and 2, includes:

(a) a projection optical system (PL) for projecting the image of a pattern formed on a mask (R) onto a photosensitive substrate (W);

(b) synchronous scanning means (3, 11, 14, 16, 20) for scanning the mask (R) and the photosensitive substrate (W) in synchronism with each other in a predetermined scanning direction perpendicular to the optical axis of the projection optical system (PL);

(c) a memory device (17) for storing therein information regarding a variation in the position of the image plane of the projection optical system (PL) when the mask (R) is being scanned in the scanning direction by the synchronous scanning means (3, 11, 14, 16, 20); and (d) an adjusting device (10) for adjusting the positional relationship between the photosensitive substrate (W) and the image plane of the projection optical system (PL) on the basis of the information stored in the memory device (17) so that the image plane of the projection optical system (PL) and the predetermined surface of the photosensitive substrate (W) may coincide with each other while the mask (R) and the photosensitive substrate (W) are scanned in synchronism with each other by the synchronous scanning means (3, 11, 14, 16, 20) to thereby expose the pattern of the mask (R) onto the photosensitive substrate (W).

According to such present invention, the information regarding a variation in the positional relationship between the mask (R) and the projection optical system (PL) in the direction of the optical axis of the projection optical system (PL) while the mask (R) is moved in the predetermined direction perpendicular to the optical axis of the projection optical system (PL) is stored in the memory device (17). When the pattern on the mask (R) is to be transferred onto the substrate (W), the position and inclination of the photosensitive substrate (W) is corrected on the basis of the information stored in the memory device (17). This leads to the advantage that even when the positional relationship between the mask and the projection optical system varies during scanning, the mask pattern can be exposed onto the photosensitive substrate in a good state. Also, even if the adsorbing surface for the pattern surface of the mask (R) and the running surface of the mask stage (3) are not parallel to each other due to the manufacturing error or the like of the mask stage (3), the mask pattern can always be exposed onto the photosensitive substrate with good focus accuracy.

DESCRIPTION OF THE PREFERRED EMBODIMENT

An embodiment of the present invention will hereinafter be described with reference to the drawings. The present embodiment uses as a projection optical system a refraction type (lens projection type) projection optical system comprising a refracting lens.

Figure 1:
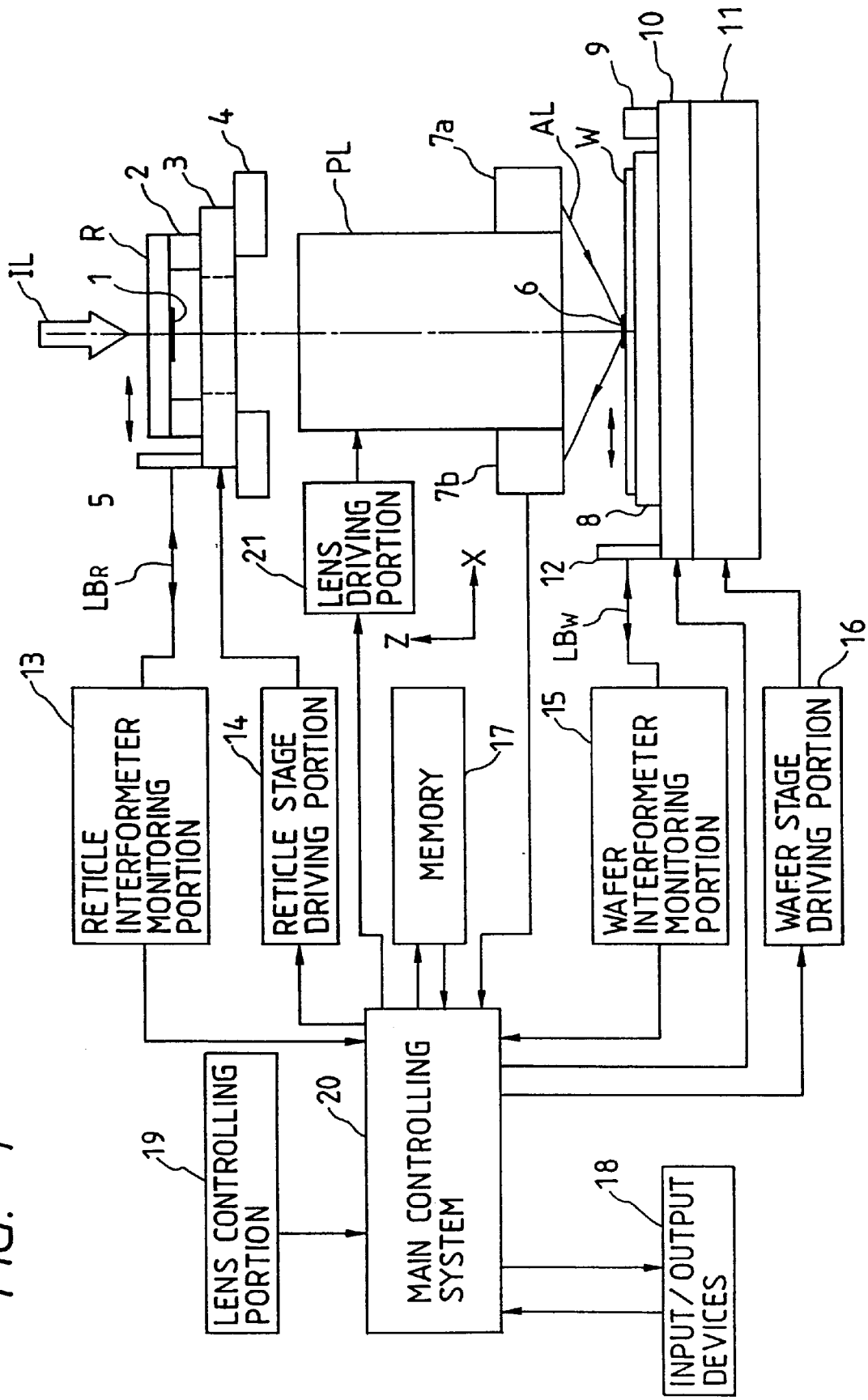
FIG. 1 is a construction diagram showing a projection exposure apparatus according to an embodiment of the present invention.

FIG. 1 shows a projection exposure apparatus according to the present embodiment. In FIG. 1, exposure light IL from an illuminating system (not shown) provided with an exposure light source is applied to a slit-like illuminated area 1 on the pattern surface (lower surface) of a reticle R with substantially uniform illuminance. The reticle R is held on the upper surface of a reticle holder 2 by a vacuum chuck, and the reticle holder 2 is fixed on a reticle stage 3 which is placed on a reticle guide 4 for sliding movement in X-direction by an air guide or the like.

During scanning exposure, the reticle stage 3 is scanned on the reticle guide 4 in X-direction or −X-direction at a predetermined speed by a linear motor system or the like. The scanning direction of the reticle R is ±X-directions.

A movable mirror 5 is fixed to one end of the reticle stage 3 in X-direction. A reticle interferometer monitoring portion 13 applies a measuring laser beam $LB_R$ to the movable mirror 5 and detects the reflected light thereof. It normally measures the position of the reticle stage 3 in X-direction. The result of the measurement by the reticle interferometer monitoring portion 13 is supplied to a main controlling system 20, which controls the movement speed and moved position of the reticle stage 3 through a reticle stage driving portion 14.

The image of a pattern within the illuminated area 1 on the reticle R is formed in a slit-like exposure area 6 on a wafer W through a projection optical system PL. The Z-axis is taken in parallelism to the optical axis of the projection optical system PL. The wafer W is held on a wafer holder 8 by a vacuum chuck, the wafer holder 8 is placed on a Z levelling stage (including a driving portion) 10 as a correcting mechanism for the exposed surface of the wafer W, and the Z levelling stage 10 is placed on an XY stage 11. The Z levelling stage 10 is comprised of a Z stage for roughly positioning the wafer W in Z-direction parallel to the optical axis of the projection optical system PL, and a levelling table for adjusting, for example, the amount of expansion and contraction of three actuators to thereby finely adjust the position (focus position) and angle of inclination of the wafer in Z-direction. Also, the XY stage 11 has the functions of positioning the wafer W placed on the Z levelling stage 10 in two-dimensional plane (XY plane) perpendicular to the optical axis of the projection optical system, and scanning the wafer W in ±X-directions.

A movable mirror 12 is fixed on the Z levelling stage 10. A wafer interferometer monitoring portion 15 applies a measuring laser beam $LB_W$ to the movable mirror 12 and detects the reflected light thereof. It normally measures the coordinates of the Z levelling stage 10 (wafer W) on XY plane. The result of the measurement is supplied to the main controlling system 20, which thus controls the movement of the XY stage 11 through a wafer stage driving portion 16. Further, the main controlling system 20 controls the movement of the Z levelling stage 10. Also, during scanning exposure, the main controlling system 20 controls the movement of the XY stage 11 and scans the wafer W in X-direction (or −X-direction) at a predetermined speed. When the projection magnification of the projection optical system PL is β, the main controlling system 20 causes the wafer W to be scanned in X-direction at a speed $V_{W0}$ (=β·$V_{R0}$) in synchronism with causing the reticle R to be scanned in −X-direction at a speed $V_{R0}$. Conversely, when the reticle R is caused to be scanned in X-direction, the wafer W is caused to be scanned in −X-direction. Also, the main controlling system 20 generally controls the operation of the entire apparatus, in addition to controlling the movement of the reticle stage 3, the Z levelling stage 10 and the XY stage 11.

Now, in the present embodiment, an optical type focus position detecting system for auto focusing (hereinafter referred to as the "AF sensor") is used as a sensor for detecting the state of the exposed surface of the wafer W. The AF sensor is comprised of a light transmitting system 7a and a light receiving system 7b, and detection light AL from the light transmitting system 7a is projected as a slit pattern image onto the exposed surface of the wafer W within the exposure area 6 obliquely with respect to the optical axis of the projection optical system PL. The reflected light from this slit pattern image re-forms a slit pattern image on the slit portion of a vibration slit plate in the light receiving system 7b, and the detection light AL passed through the slit of the vibration slit plate is photoelectrically converted by a photoelectric converter. This photoelectrically converted signal is synchronously detected by a driving signal for the vibration slit plate, whereby there is obtained a focus signal linearly varying within a predetermined range in conformity with the position of the exposed surface of the wafer W in the direction of the optical axis. This focus signal is supplied to the main controlling system 20. In this case, calibration is effected so that the focus signal may become e.g. 0 in a state in which the exposed surface of the wafer W coincides with the imaging plane of the projection optical system PL.

The detailed construction of the AF sensor is disclosed, for example, in the applicant's U.S. Pat. No. 4,650,983. Also, in addition to the AF sensor 7a, 7b, use may be made, in combination, of a levelling sensor for detecting the angle of inclination of the exposed surface of the wafer W in the slit-like exposure area 6 by a collimator system. Also, to enhance the in-focus controlling property in scanning exposure, use may be made of a pilot reading detection system for detecting the focus position at multiple measuring points within an area including an area on this side in the scanning direction with respect to the exposure area 6. This system is shown in U.S. patent application Ser. No. 172,098 (filed Dec. 23, 1993) by the applicant.

Also, a fiducial mark member 9 having its surface set at the same level as the exposed surface of the wafer W is fixed on the Z levelling stage 10. A slit pattern is formed on the surface of the fiducial mark member 9. This fiducial mark member 9 is moved into the exposure area 6 of the projection optical system PL and the slit pattern on the fiducial mark member 9 is illuminated with illuminating light of the same wavelength as the illuminating light IL for exposure, from within the fiducial mark member 9. The light passed through this slit pattern forms a slit pattern image on the pattern surface of the reticle R through the projection optical system PL, the reflected light from the pattern surface is returned to the slit pattern on the surface of the fiducial mark member 9 through the projection optical system PL, and the thus returned reflected light is directed to a photoelectric converter within the fiducial mark member 9 through a beam splitter or the like.

If in this case, the pattern surface of the reticle R in the illuminated area 1 and the exposed surface of the wafer W in the exposure area 6 are in in-focus state, the quantity of light returned to the slit pattern becomes maximum and therefore, by monitoring the output signal of the photoelectric converter, it is possible to monitor the in-focus state. Since the focus position of the exposed surface of the wafer W relative to the focus position detecting system can be monitored by the above-described AF sensor 7a, 7b, conversely the position of the pattern of the reticle R in the direction of the optical axis can be monitored by detecting the focus position of the exposed surface of the wafer W relative to the focus position detecting system when the output signal of the photoelectric converter within the fiducial mark member 9 becomes maximum. This detecting system is shown in U.S. patent application Ser. No. 993,460 (filed Dec. 15, 1992) by the applicant.

Also, design is made such that an operator can input various kinds of information from the outside to the main controlling system 20 through input/output devices 18. The information to be inputted includes, for example, the offset information of the focus signal of the AF sensor found by test print or the like. Also, a lens controlling portion 19 is connected to the main controlling system 20. The lens controlling portion 19, as disclosed in U.S. Pat. Nos. 4,687,322, 4,780,747, etc., calculates any variation in the position of the imaging plane of the projection optical system PL caused by a variation in atmospheric pressure or exposure light absorbed into the projection optical system PL, and supplies the result of this calculation to the main controlling system 20. Also, a lens driving portion 21 can move at least one lens in the projection optical system PL in the direction of the optical axis of the projection optical system PL (Z-direction). It can also incline said lens with respect to a plane perpendicular to the optical axis. The main controlling system 20 can control the imaging characteristic of the projection optical system PL through the lens driving portion 21 to thereby bring about a desired state.

Figure 3A:
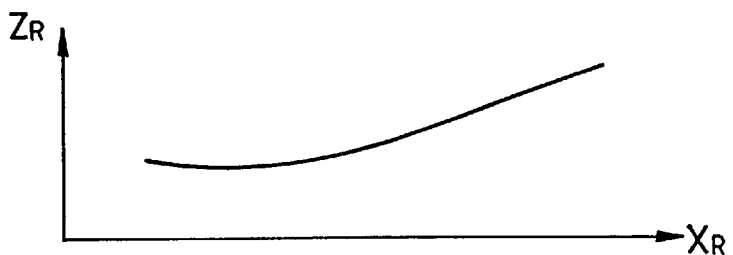
FIGS. 3A, 3B and 3C show examples of a function indicative of the positional relationship of the reticle and the projection optical system to the scanning position of the reticle.
Figure 3B:
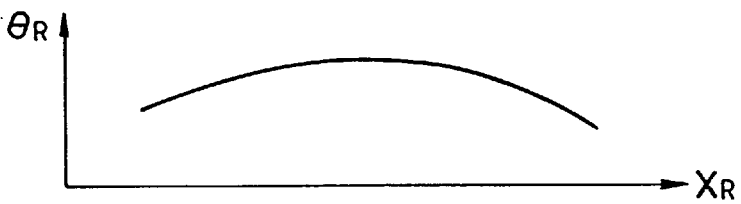
Figure 3C:
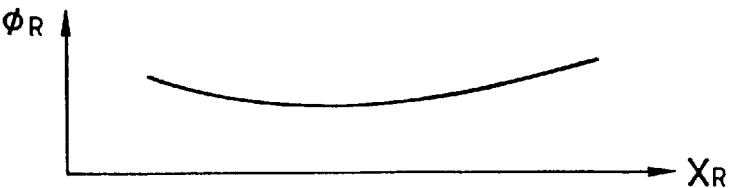

Also, a memory 17 is connected to the main controlling system 20, and in the memory 17, for example, the positional relationship between the reticle R and the projection optical system PL resulting from the scanning pre-measured by the use of the fiducial mark member 9 is stored as the function information of the position $X_R$ of the reticle R in the scanning direction. The positional relationship between the reticle R and the projection optical system PL, as shown, for example, in FIGS. 3A to 3C, is decomposed into three components, i.e., a position $Z_R$ in Z-direction (FIG. 3A), the angle of inclination $\theta_R$ of the reticle R in XZ plane parallel to the plane of the drawing sheet of FIG. 1 (FIG. 3B) and the angle of inclination $\phi_R$ of the reticle R in YZ plane perpendicular to the plane of the drawing sheet of FIG. 1 (FIG. 3C) and is pre-stored in the memory 17. Description will hereinafter be described as to how to find the function information indicative of this positional relationship.

Figure 2:
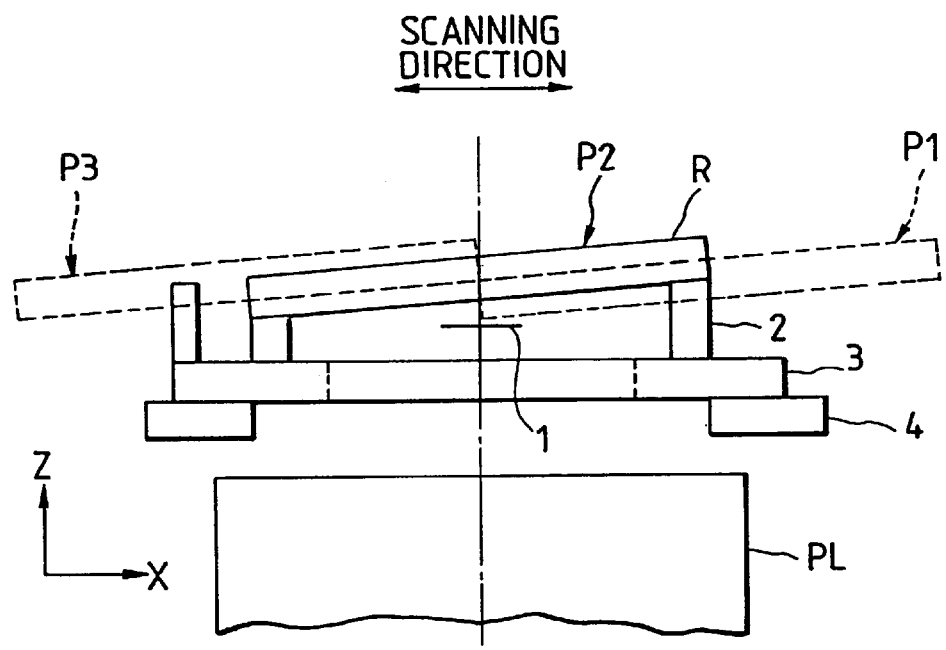
FIG. 2 shows an example of a case where with scanning, the positional relationship between a reticle and a projection optical system varies within a slit-like illuminated area 1.

FIG. 2 shows the manner in which the reticle R is scanned relative to the illuminated area 1. Also, FIG. 2 shows a case where the reticle scanning surface (the running surface of the reticle stage 3) and the adsorbing surface for the pattern surface of the reticle R are not parallel to each other, as an example of the case where the positional relationship between the projection optical system PL and the reticle R in the illuminated area 1 varies with the scanning of the reticle. In this case, it is seen that in a state in which the reticle R is at the rightmost position P1, a state in which the reticle R is at the central position P2 and a state in which the reticle R is at the leftmost position P3, the level $Z_R$ of the pattern surface of the reticle R relative to the projection optical system PL varies within the slit-like illuminated area 1. The main controlling system 20 moves the reticle R by a predetermined step amount from the position P1 and also measures the position of the pattern surface of the reticle R within the illuminated area 1 in Z-direction at a plurality of predetermined points (e.g. four points) by the use of the fiducial mark member 9 shown in FIG. 1. In this manner, the main controlling system takes data regarding the positional relationship between the projection optical system PL and the reticle R in the illuminated area 1 while moving the reticle R, whereby there are finally obtained such functions as shown in FIGS. 3A, 3B and 3C.

Description will now be made of the operation when in the present embodiment, the pattern of the reticle R is exposed onto the wafer W by the scan system. The main controlling system 20 first starts the synchronized scanning of the reticle R and the wafer W. Thereafter, the main scanning system 20 multiplies the amount of variation of the pattern surface of the reticle R determined from the function information in the memory 17 by the square of the projection magnification of the projection optical system PL to thereby calculate the amount of variation of the imaging plane of the projection optical system each time the scanning position $X_R$ of the reticle R varies by the predetermined step amount. Therewith, the main controlling system 20 adds the foreseen fluctuation value of the image plane supplied from the lens controlling portion 19 to the amount of variation of the imaging plane to thereby find the total value of the amount of variation of the imaging plane of the projection optical system PL. Then, it supplies the Z levelling stage 10 with such control information that the exposed surface of the wafer W coincides with the imaging plane determined by said total value. Accordingly, the exposed surface of the wafer W is sequentially controlled so as to coincide with the true imaging plane of the projection optical system PL in conformity with the scanning position of the reticle R.

Figure 4A:
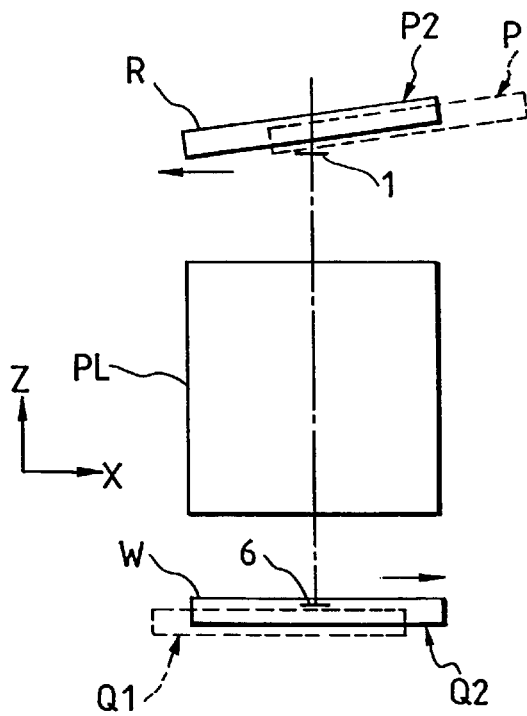
FIGS. 4A and 4B show an example of the operation of correcting the focus position of a wafer in conformity with the scanning position of the reticle.
Figure 4B:
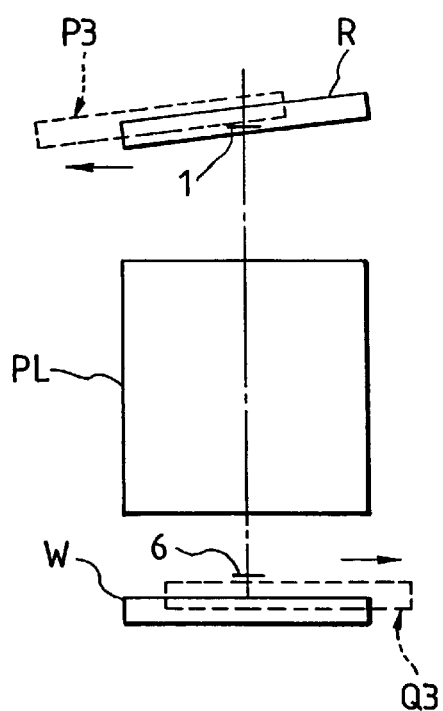

Specifically, consider, for example, a case where only the focus position of the wafer W is adjusted when the pattern surface of the reticle R is not parallel to the running surface of the reticle stage. In this case, it is to be understood that the reticle R and the wafer W are in in-focus state (but the angle of inclination is neglected) when as shown in FIG. 4A, the reticle R is at a position P2 and the wafer W is at a position Q2. When the reticle R is at a position P1 and the pattern surface is close to the projection optical system PL side, the exposed surface of the wafer W is lowered as indicated at a position Q1. Conversely, when as shown in FIG. 4B, the reticle R is at a position P3 and the pattern surface is far from the projection optical system PL, the exposed surface of the wafer W is elevated as indicated at a position Q3. Thereby, the pattern image of the reticle R is always exposed onto the wafer W with high resolution.

Figure 5A:
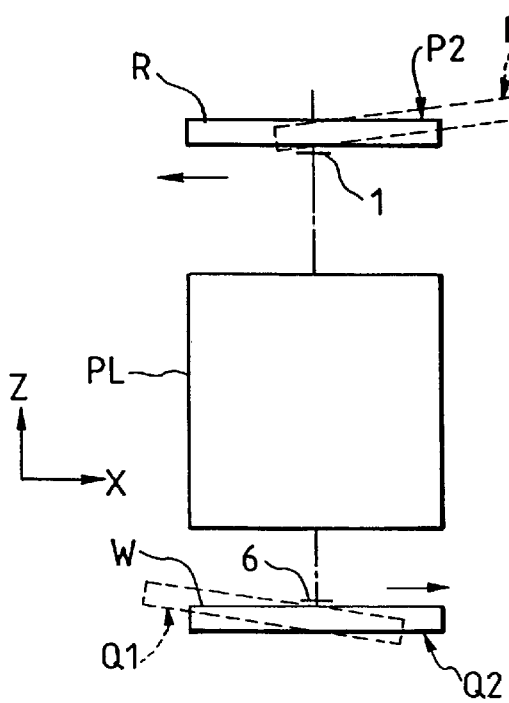
FIGS. 5A and 5B show an example of the operation of correcting the inclination of the wafer in conformity with the scanning position of the reticle.
Figure 5B:
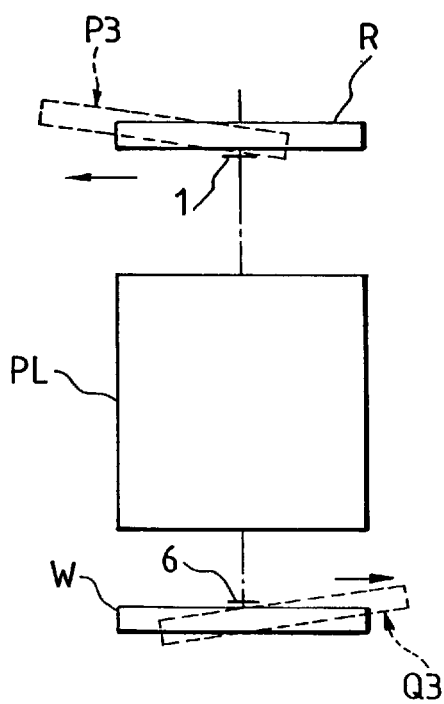

Also, consider, for example, a case where the inclination of the wafer W is adjusted when the running surface of the reticle stage is not parallel to XY plane. Here, consider only the inclination of the reticle R in XZ plane. In this case, it is to be understood that when the reticle R is at the position P2 and the wafer W is at the position Q2, the reticle R and the wafer W are in in-focus state. When the reticle R is at the position P1 and the pattern surface is inclined downwardly (in −Z-direction) toward the scanning direction (−X-direction), the exposed surface of the wafer W is likewise inclined downwardly (in −Z-direction) toward the scanning direction (+X-direction) as indicated at the position Q1. Also, when as shown in FIG. 5B, the reticle R is at the position P3 and the pattern surface is inclined upwardly (in +Z-direction) toward the scanning direction (−X-direction), the exposed surface of the wafer W is likewise inclined upwardly (in +Z-direction) toward the scanning direction (+X-direction). Thereby, the pattern image of the reticle R is always exposed onto the wafer W with high resolution.

Also, in the present embodiment, the main controlling system 20 adjusts the level and inclination of the exposed surface of the wafer W in conformity with the variation in the imaging plane of the projection optical system PL, but a particular lens in the projection optical system PL can be moved in the direction of the optical axis through the lens driving portion 21 to thereby move the imaging plane of the projection optical system in the direction of the optical axis.

Also, it is possible to incline a particular lens or shift the particular lens in a direction perpendicular to the optical axis to thereby incline the imaging plane. By driving the lens as described above, the imaging plane of the projection optical system PL and the exposed surface of the wafer W can be brought into coincidence with each other. This may also be effected by combining the movement of a lens in the projection optical system and the adjustment of the position of the exposed surface of the wafer W.

Finally, description will be made of other examples of the method of finding the function information shown in FIGS. 3A, 3B and 3C.

A first method is a method using wafer exposure (test print). In FIG. 1, a wafer W having a very good degree of flatness is first placed on the wafer holder 8. The reticle R is then fixed at a certain position ($X_R$) in the scanning direction, and by a method similar to that in the case of the step and repeat system, the pattern on the reticle R as exposed onto the wafer W in a matrix-like form. The height and inclination of the image plane within the slit-like exposure area 6 are found from the data of the projected image of the thus exposed wafer W. The position $X_R$ of the reticle R is then changed a little from the initial position $X_{R1}$ to take the data as described above, whereby the functions as shown in FIGS. 3A, 3B and 3C are finally obtained.

A second method is a method which does not require wafer exposure, and uses a focus detecting mechanism of the through-the-lens type not shown in FIG. 1. For example, the spatial image of the pattern of the reticle R is measured by a detector having its light receiving surface set at the same level as the exposed surface of the wafer W on the Z levelling stage 10, and the position at which the image is sharpest can be considered to be the in-focus position. By effecting such measurement while changing the position $X_R$ of the reticle R in the scanning direction, there can be finally obtained the function information as shown in FIGS. 3A, 3B and 3C. This mechanism is disclosed in detail in U.S. Pat. No. 4,711,569.

The position of the image plane of the projection optical system can also be found by the use of a detecting system for applying a slit pattern image from the fiducial mark member 9 to the reticle R, and photoelectrically detecting the light transmitted through the reticle R (see U.S. Pat. No. 4,952, 815), or a detecting system using a grating plate (see U.S. Pat. No. 4,808,807), and the function information as shown in FIGS. 3A, 3B and 3C can be obtained.

The function information obtained by one of the two methods as described above is stored, for example, from the input/output devices 18 into the memory 17 through the main controlling system 20. Also, the function information need not be continuous with respect to the position $X_R$ of the reticle R in the scanning direction as shown in FIGS. 3A, 3B and 3C, but may be of a discrete table type.

While the above embodiment has been described with respect to a case where a refracting system is used as the projection optical system, the present invention is equally applicable to a case where a reflection type projection optical system or a catadioptric type projection optical system is used as the projection optical system. Thus, the present invention is not restricted to the above-described embodiment, but may assume various constructions without departing from the gist of the invention.

I claim:

1. A scanning exposure method comprising:

relatively moving a mask and an illuminated area of an exposure beam during a scanning exposure, an image of a pattern of said mask being projected onto a substrate through a projection system; and performing, during the scanning exposure, an imaging adjustment in order to compensate for change of the image projected onto the substrate that would be caused by a scanning error of the mask, the scanning error causing a positional variation of a pattern surface of the mask along an axis of the projection system.

2. A scanning exposure method according to claim 1, wherein the imaging adjustment includes an adjustment of the projection system.

3. A scanning exposure method according claim 1, wherein the imaging adjustment includes a relative shift between an image plane surface formed through the projection system and the substrate.

4. A scanning exposure method according to claim 1, wherein the imaging adjustment is performed in synchronism with the movement of the mask.

5. A scanning exposure method according to claim 1, wherein the positional variation includes a change in an inclination of the pattern surface.

6. A scanning exposure method according to claim 5, wherein, during the scanning exposure, the mask and the substrate are moved synchronously while the mask is moved by using a mask driving system and the substrate is moved by using a substrate driving system.

7. A scanning exposure method according to claim 6, wherein the mask is moved in a scanning direction during the scanning exposure, and wherein prior to the scanning exposure, the positional variation of the pattern surface of the mask is measured while moving the mask in the scanning direction.

8. A scanning expsosure method according to claim 7, wherein the positional variation of the pattern surface of the mask is measured by detecting light from the pattern surface of the mask via the projection system.

9. A scanning exposure method according to claim 8, wherein the positional variation of the pattern surface of the mask is stored in correspondence with positions of the mask in the scanning direction.

* * * * *